US005936558A

United States Patent [19]
Shafiee et al.

[11] Patent Number: 5,936,558
[45] Date of Patent: Aug. 10, 1999

[54] SIGNAL SPACE DETECTOR FOR CHANNELS UTILIZING A CODE HAVING TIME VARYING CONSTRAINTS

[75] Inventors: Hamid R. Shafiee, Bloomington; Bernardo Rub, Edina, both of Minn.

[73] Assignee: Seagate Technology, Inc., Scotts Valley, Calif.

[21] Appl. No.: 09/076,961

[22] Filed: May 13, 1998

Related U.S. Application Data

[60] Provisional application No. 60/046,410, May 14, 1997.

[51] Int. Cl.$^6$ .................................................. H03M 13/12
[52] U.S. Cl. ........................... 341/59; 360/48; 371/40.15
[58] Field of Search ....................... 341/58, 59; 371/43.4, 371/40.14, 40.15, 43.7; 360/40, 48

[56] References Cited

U.S. PATENT DOCUMENTS

| | | | |
|---|---|---|---|
| 4,321,632 | 3/1982 | Leis et al. | 360/49 |
| 4,567,591 | 1/1986 | Gray et al. | 370/109 |
| 4,593,353 | 6/1986 | Pickholtz | 364/200 |
| 4,949,196 | 8/1990 | Davie et al. | 341/59 |
| 5,036,408 | 7/1991 | Leis et al. | 360/48 |
| 5,243,605 | 9/1993 | Lekmine et al. | 371/43 |
| 5,253,131 | 10/1993 | Chevalier | 360/78.14 |
| 5,278,703 | 1/1994 | Rub et al. | 360/51 |
| 5,321,559 | 6/1994 | Nguyen et al. | 360/46 |
| 5,353,352 | 10/1994 | Dent et al. | 380/37 |
| 5,404,249 | 4/1995 | Seki | 360/48 |
| 5,434,807 | 7/1995 | Yoshida | 364/717 |
| 5,438,462 | 8/1995 | Copolillo | 360/53 |
| 5,485,472 | 1/1996 | Fredrickson | 371/43 |
| 5,537,424 | 7/1996 | Karabed et al. | 371/43 |
| 5,717,535 | 2/1998 | French et al. | 360/63 |
| 5,731,768 | 3/1998 | Tsang et al. | 341/59 |
| 5,771,127 | 6/1998 | Reed et al. | 360/51 |
| 5,784,417 | 7/1998 | Alamouti | 371/434 |

OTHER PUBLICATIONS

"Error Control Coding" Fundamentals and Applications, by Shu Lin, University of Hawaii, Texas A&M University and Daniel J. Costello, Jr., Illinois Institute of Technology, (1983) pp. 528–531.

J. Moon and B. Brickner, "Maximum Transition Run Codes for Data Storage Systems", *IEEE Transactions on Magnetics*, vol. 31, No. 2, pp. 1202–1207, Sep. 1996.

B. Brickner and J. Moon, "Design of a Rate 5/6 Maximum Transition Run Code", *Digestss of Intermag* 1997.

B. Brickner and J. Moon, "A High–Dimensional Signal Space Implementation of FDTS/DF", *IEEE Transactions on Magnetics*, vol. 32, No. 5, pp. 3941–3943, Sep. 1996.

A. Patel, R. Rutledge and B. So, "Performance Data for a Six–Sample Look–Ahead, 1,7 ML Detection Channel", *IEEE Transaction on Magnetics*, vol. 29, No. 6, pp. 4012–4014, Nov. 1993.

R. Yamasaki et al., "A 1,7 code EEPR4 Read Channel IC with Analog Noise Whitened Detector", *Proceedings of ISSCC*, 1997, pp. 316–317.

J.W.M. Bergmann, S.A. Rajput and F.A.M. van de Laar, "On The Use of Decision Feedback for Simplifying the Viterbi Detector", *Phillips Journal of Research*, vol. 42, No. 4, pp. 399–428, 1987.

*Primary Examiner*—Howard L. Williams
*Attorney, Agent, or Firm*—Westman, Champlin & Kelly, P.A.

[57] ABSTRACT

Data is detected from a disc in a disc drive and provided as a sampled read signal including data samples provided in a plurality of time intervals. A signal space detector is configured to detect the data, wherein the data is encoded according to a code having a time varying maximum transition run constraint which varies between a first and a second constraint over a plurality of time intervals. The detector is configured to receive an input sample including a first plurality of terms indicative of one of a plurality of possible data symbols. One of the plurality of possible data symbols is eliminated based on the first constraint when the input sample then being detected is constrained by the first constraint, to provide a second plurality of remaining possible data symbols. An estimated data value is determined which corresponds to the input sample then being detected, by determining which of the second plurality of remaining possible data symbols is within a predetermined range of the input symbol.

19 Claims, 7 Drawing Sheets

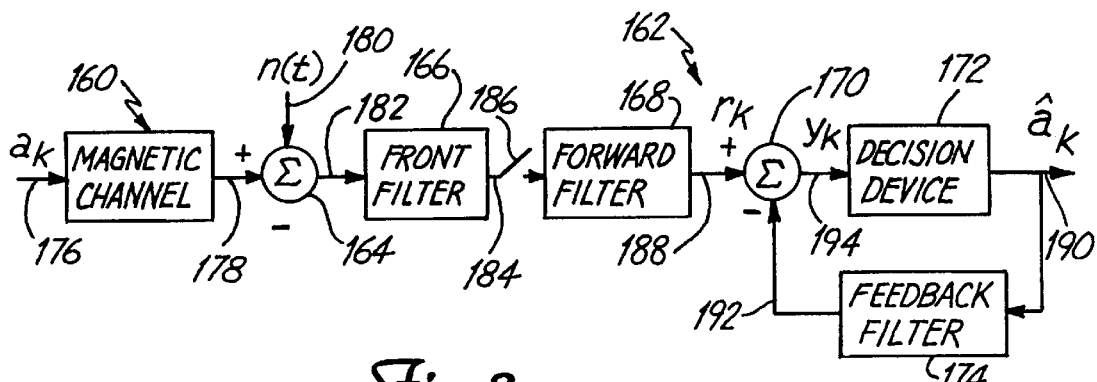
Fig. 3
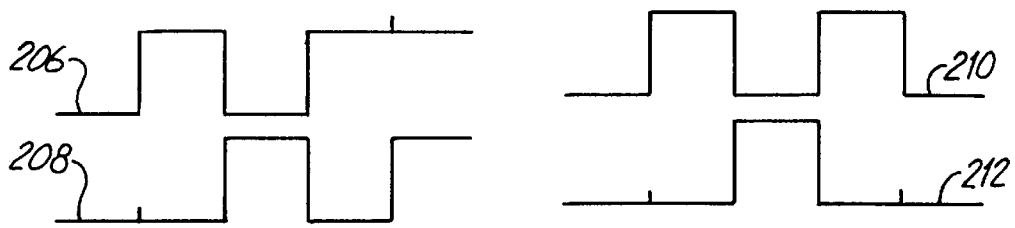
Fig. 5-1
Fig. 5-2

SIGNAL SPACE DETECTOR FOR CHANNELS UTILIZING A CODE HAVING TIME VARYING CONSTRAINTS

REFERENCE TO RELATED APPLICATION

The present application claims priority from provisional application Ser. No. 60/046,410 filed on May 14, 1997.

FIELD OF THE INVENTION

The present invention relates to disc drives. More particularly, the present invention relates to a data detector in a disc drive wherein the data detector detects data encoded according to a code having time varying constraints.

BACKGROUND OF THE INVENTION

A typical disc drive includes one or more discs mounted for rotation on a hub or spindle. A typical disc drive also includes a transducer supported by a hydrodynamic air bearing which flies above each disc. The transducer and the hydrodynamic air bearing are collectively referred to as a data head. A drive controller is conventionally used for controlling the disc drive based on commands received from a host system. The drive controller controls the disc drive to retrieve information from the discs and to store information on the discs.

In one conventional disc drive, an electromechanical actuator operates within a negative feedback, closed-loop servo system. The actuator moves the data head radially over the disc surface for track seek operations and holds the transducer directly over a track on the disc surface for track following operations.

Information is typically stored in concentric tracks on the surface of the discs by providing a write signal to the data head to write information on the surface of the disc representing the data to be stored. In retrieving data from the disc, the drive controller controls the electromechanical actuator so that the data head flies above the disc and generates a read signal based on information stored on the disc. The read signal is typically conditioned and then decoded by the drive controller to recover the data.

A typical read channel includes the data head, preconditioning logic (such as preamplification circuitry and filtering circuitry), a data detector and recovery circuit, and error detection and correction circuitry. The read channel is typically implemented in a drive controller associated with the disc drive.

In disc drives, it is important that the error rate per number of bits recorded (the bit error rate) be maintained at a relatively low level. In order to improve bit error rate performance in disc drives, or in order to increase the linear recording density in disc drives, maximum likelihood sequence detection (MLSD) methods are desired. Such methods can be implemented using the well known Viterbi algorithm. However, a direct implementation of an MLSD method is very costly. For example, the channel response after forward filtering is typically quite long, and may contain ten or more terms. Thus, a Viterbi detector would require $2^{10-1}$ sates, which is impractically complex. Therefore, other techniques have been investigated which tend to reduce complexity yet still provide results which approach those of direct MLSD methods.

One such technique is to apply the Viterbi algorithm to a reduced number of terms by cancelling some of the terms with feedback. For example, by cancelling all but two terms (and including the main cursor) allows the Viterbi detector to have only four states. Such detectors are referred to as reduced state sequence estimators (RSSE).

Another technique is to choose a channel response target which is not a perfectly whitened target, but which has a fewer number of terms. In such systems, partial response (PR) targets have been developed. Among those targets is one referred to as enhanced extended partial response maximum likelihood ($E^2$PRML) target. At high recording densities, it has been observed that for certain high order partial response channels (such as the $E^2$PRML) channel, the dominant error events (the difference between two input sequences) encountered with detectors used with such partial response targets are generally of the form $\pm(2,-2,2)$. Such errors are typically caused when a tribit is shifted by one sample time, or when a quadbit is mistaken as a dibit or vise versa.

SUMMARY OF THE INVENTION

A relatively new class of codes are recently being investigated. Such codes include a maximum transition run (MTR) code which has been proposed as a way of removing dominant error events from the input bit stream to the data detector. MTR codes act to increase the minimum Euclidean distance between data samples in a magnetic recording channel.

For example, an MTR=2 code limits the run of consecutive transitions in the modified waveform to two. In essence, an MTR=2 code removes all patterns of encoded data containing more than two consecutive transitions. Consequently, the MTR=2 code also removes all patterns which cause a dominant error event for MLSD detectors at high recording densities and higher order PR channels.

Using MTR constraints, one detector has been developed which is referred to as the 3D-110 detector whose performance is comparable to a fixed delay tree search with decision feedback of depth 2 (FDTS/DF(2)) at high symbol densities. The detector is constructed by considering vectors of received samples (for example three samples) in a three dimensional space. Three planar boundaries are calculated and are used to divide the signal space into two regions, each of which correspond to a decision of +1 or −1 for the bit currently being processed. The 3D-110 detector also includes a forward filter which removes precursor intersymbol interference (ISI) terms and forces the two post cursor ISI terms to be 1 and 0, respectively, where the cursor is also normalized to 1. Feedback filters are implemented which remove all but the two post cursor ISI terms. Therefore, with no error propagation through the detector, the equivalent discrete-time channel pulse response can be denoted as 110. Such a constraint on the channel response is used to simplify the detector structure.

While the magnetic channel natural response is close to the 110 target at high recording densities, it deviates significantly from the 110 target at lower recording densities. Thus, constraining the pulse response to this particular 110 target results in performance degradation compared to the FDTS/DF(2), specifically at lower recording densities. Even at high densities, the implementation of practical elements in the detector can also cause deviation of the channel response from the 110 target. For example, the use of constrained length finite impulse response (FIR) filters can cause such deviation.

Thus, while the 3D-110 channel provides significant advantages in performance and/or simplicity over other detectors (such as the more complicated FTDS/DF(2) detector) it does contain the above-described disadvantages.

The present invention is directed to a system that addresses these and other problems, and offers other advantages.

Data is detected from a disc in a disc drive and provided as a sampled read signal including data samples provided in a plurality of time intervals. A signal space detector is configured to detect the data, wherein the data is encoded according to a code having a time varying maximum transition run constraint which varies between a first and a second constraint over a plurality of time intervals. The detector is configured to receive an input sample including a first plurality of terms indicative of one of a plurality of possible data symbols. One of the plurality of possible data symbols is eliminated based on the first constraint when the input sample then being detected is constrained by the first constraint, to provide a second plurality of remaining possible data symbols. An estimated data value is determined which corresponds to the input sample then being detected, by determining which of the second plurality of remaining possible data symbols is within a predetermined range of the input symbol.

When an input sample is received which is constrained by the second constraint, the input sample includes an additional term. One of the first plurality of possible data symbols is eliminated based on the second constraint and based on which of a subset of the first plurality of data symbols is within a predetermined range of the second input sample.

In one embodiment, the estimated value is determined by determining a placement of the input sample relative to a first plurality of planes in a multi-dimensional space wherein the first plurality of planes divides the second plurality of remaining possible data symbols in the multi-dimensional space. The estimated value is determined by determining which of the remaining possible data symbols corresponds to the input sample based on the placement of the input sample relative to the plurality of planes in the multi-dimensional space.

BRIEF DESCRIPTION OF THE DRAWINGS

FIG. 3 is a schematic diagram illustrating a magnetic channel and associated reading circuitry to better illustrate notation used herein.

FIGS. 4-1 and 4-2 illustrate symbol constellations corresponding to a detector in accordance with one aspect of the present invention.

FIGS. 5-1 and 5-2 show waveforms illustrating dominant error events.

FIGS. 7-1 and 7-2 illustrate a FTDS/DF tree used to illustrate operation of a detector in accordance with one aspect of the present invention.

DETAILED DESCRIPTION OF THE PREFERRED EMBODIMENTS

Figure 1:
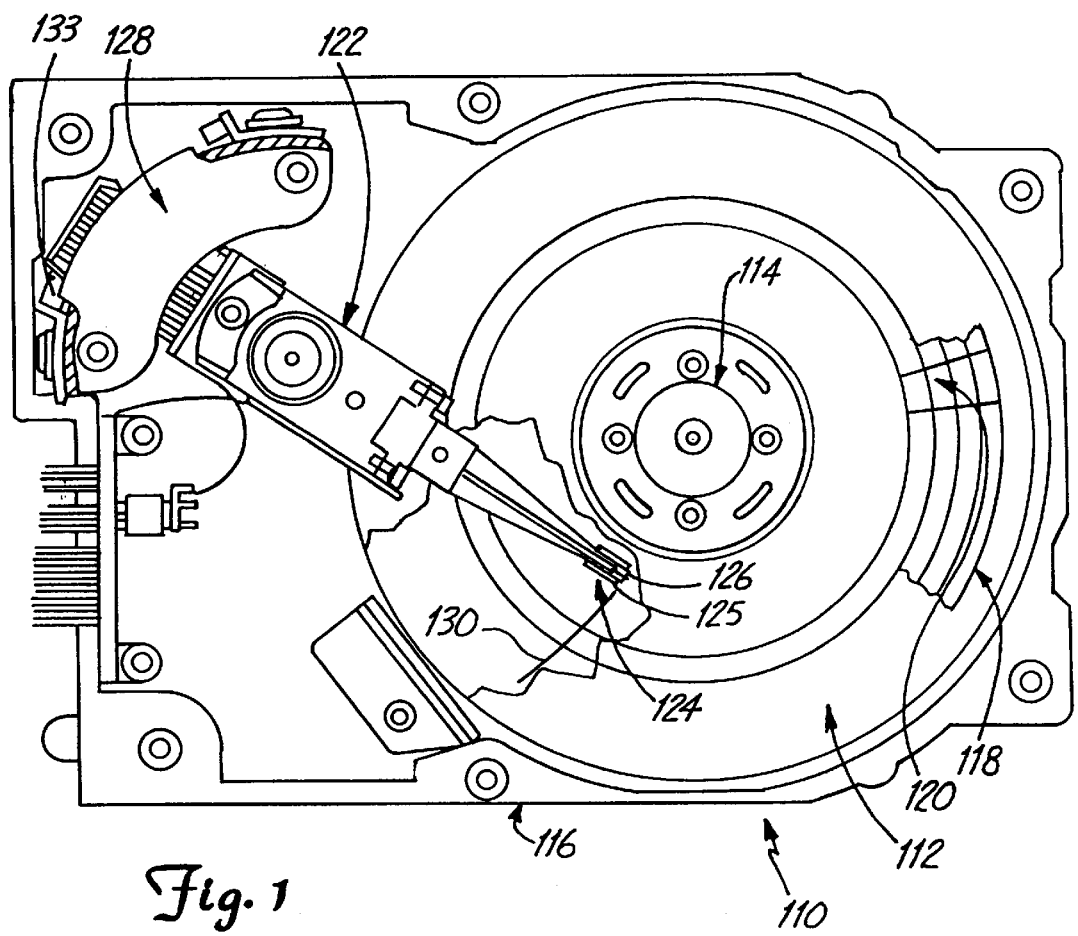
FIG. 1 is a top view of a disc drive with its upper casing removed and embodying features of the present invention.

Referring to FIG. 1, a rotary disc drive system suitable for incorporating the teachings of the present invention is shown in diagrammatic form and is referred to generally at 110. A plurality of information storage discs 112 are journaled about a spindle motor assembly 114 within a housing 116. Each disc 112 has a multiplicity of concentric circular recording tracks, indicated schematically at 118 for recording information. Each track 118 is subdivided into a plurality of sectors, indicated schematically at 120. Data can be stored on or retrieved from the discs 112 by referencing a specific track 118 and sector 120. An actuator arm assembly 122 is rotatably mounted preferably in one corner of the housing 116. The actuator arm assembly 122 carries a plurality of head gimbal assemblies 124 that each carry a slider 125 having a read/write head, or transducer 126, for reading information from and writing information onto the discs 112. A voice coil motor 128 is adapted to precisely rotate the actuator arm assembly 122 back and forth such that the transducers 126 move across the discs 112 along arc 130.

Figure 2:
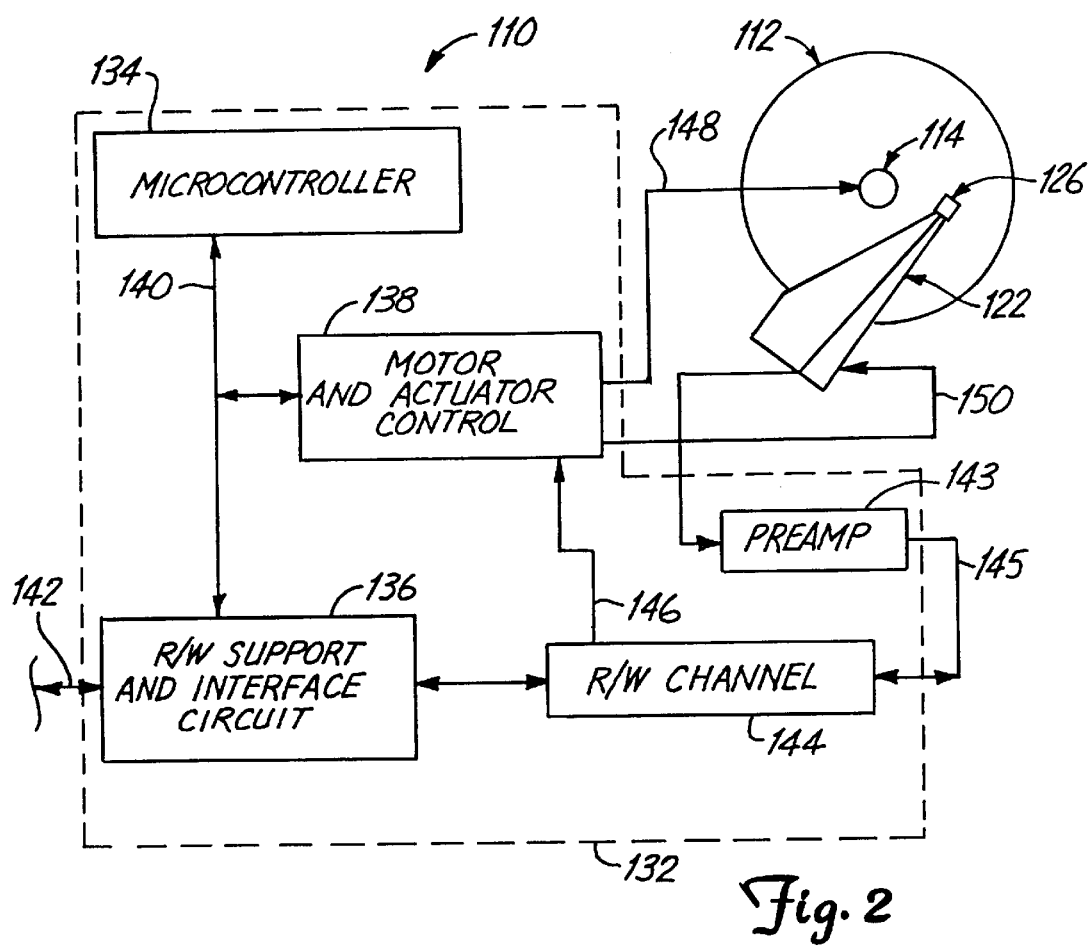
FIG. 2 is a high level block diagram of the disc drive shown in FIG. 1.

FIG. 2 shows a high level block diagram of the control circuitry 132 of disc drive system 110. The disc drive system 110 includes control circuitry 132 for controlling the position of the transducers 126 and for processing information to be written to or received from the discs 112. A microcontroller 134 directly implements all of the primary functions of the disc drive system 110. A read/write support and interface control circuit, indicated generally at 136, and a motor and actuator controller 138 are connected to the microcontroller 134 by a general purpose data, address, and control bus 140. Circuit 136 in general provides a hardware interface between the disc drive system 110 and a host computer system (not shown) via a communications bus 142. Also, circuit 136 in general provides an interface between the motor and actuator controller 138 and a read/write channel 144. The read/write channel 144 receives a signal from preamplifier 143 which, in turn, receives a signal from transducers 126. Read/write channel 144 acts as an interface between the microcontroller 134 and the transducers 126 over lines 145. The read/write channel 144 also provides signals over line 146 to the motor and actuator controller 138. Controller 138 is provided as an interface between the microcontroller 134 and the motor assembly 114 over lines 148, and an interface between the microcontroller 134 and the actuator arm assembly 122 over lines 150.

FIG. 3 is a schematic diagram of a magnetic channel 160 and detector 162 and is provided for purposes of better understanding the notation used herein. Channel 160, as is known, includes the recording medium, such as disc 112 and transducers 126. Detector 162 includes adder 164, front filter 166, forward filter 168, adder 170, decision device 172 and feedback filter 174. Detector 162 is generally implemented in read/write channel 144 shown in FIG. 2. The input 176 to magnetic channel 166 is preferably a sequence of data bits, the data bit for a current time period k is represented by $a_k$. The sequence of input bits is preferably encoded, in accordance with one aspect of the present invention, according to a code which enforces an MTR=2 code constraint, and the bits are provided in a non-return-to-zero inverse (NRZI) format in which a one is represented by a transition and a zero is represented by a non-transition.

When the data bits are read from the magnetic channel, they are provided as a readback signal 178. The readback signal 178 is typically corrupted by noise 180 which is represented by n(t) being added to the readback signal 178 by adder 164. It should be noted that noise n(t) and adder 164 are shown as only representations of the noise which corrupts readback signal 178 and are thus not part of the actual hardware implementation. In any case, the noise n(t)

is present in the readback signal 178 and becomes part of the readback signal 178.

A corrupted read signal 182 is provided to front filter 156. Front filter 156 is, by way of example, implemented as an analog low-pass filter which prevents aliasing and filters out high frequency noise and provides a sampled output 184 to forward filter 168 through appropriate switching circuitry 186.

Forward filter 168 preferably operates alone or in combination with other filtering to whiten the noise on the readback signal and provide a modified readback signal 188 (also designated $r_k$) to adder 170. An example of forward filter 168 is a finite impulse response (FIR) filter which includes a plurality of taps. Forward filter 168 removes all precursor intersymbol interference (ISI) terms. Post-cursor ISI terms are permitted to assume their natural values, because no constraints are enforced on the channel coefficients. Decision device 172 preferably implements a number of the detection techniques described herein and provides a signal 190 (also designated $â_k$) at its output.

The output $â_k$ is an estimate of the input data sequence $a_k$. The output $â_k$ is also provided to feedback filter 174 which is used to provide feedback signal 192 to adder 170. Feedback signal 192 is added to the output $r_k$ of forward filter 168. The combination of these signals is provided at the output 194 (also designated $y_k$) of adder 170 to decision device 172. In the preferred embodiment of the present invention, feedback filter 174 is intended to remove all but two post-cursor ISI terms.

Thus, assuming all the previous decisions by the decision device 172 are correct, an equivalent discrete-time channel response includes three terms and is denoted as $(1, f_1, f_2)$. Without any loss of generality, the main tap in feedback filter 174 is normalized to one.

Thus, at time k, the noiseless input $y_k$, to decision device 172 can be written as follows:

$$y_k = a_k + f_1 a_{k-1} + f_2 a_{k-2} \quad \text{Equation 1}$$

where $a_k$ is the input data bit at time k.

A three-dimensional signal space detector (3D-SSD) can be implemented by first considering a symbol constellation in three-dimensional space. Generally, the detector 162 is implemented as a 3D-SSD in accordance with the present invention. As described in greater detail below, detector 162 maps all possible symbols which could represent the input data sequence to the three-dimensional space. The detector then obtains an input sample which has a plurality of terms indicative of an input data sample in the input sample sequence. The input sample is then mapped to the same three-dimensional space in the constellation. The detector then determines which of the possible data symbols is closest in the three-dimensional space to the input sample at each time interval. This is analogous to determining a path corresponding a minimum Euclidean distance between an observed and the desired sample values for a fixed-delay detector, such as an FDTS/DF detector, or for a look-ahead partial response channel such as that described by Patel, Rutledge and So in "Performance Data For A Six-Sample Look-Ahead 1, 7 ML Detection Channel", *IEEE Trans. Magn.* Vol. 29, No. 6, pp. 4012–4014, November, 1993 and that described by Yamasaki et al., "A 1, 7 Code EEPR4 Read Channel IC With Analog Noise Whitened Detector", *PROC. of ISSCC,* 1997, pp. 316–317.

Each pair of possible symbols which point to different detector decisions are separated by a boundary plane. The planar boundaries are combined by logic rules so that the signal space is partitioned into two regions, one corresponding to a detector decision of +1 and the other corresponding to a detector decision of −1. Depending on where the detector input data sample falls in the three-dimensional vector space relative to the boundary planes, a binary decision is released by decision device 172 as the detector output $â_k$. As will also be described below, the detector structure is simplified by eliminating planes which are redundant, and also by eliminating separate symbols which are much further apart than the minimum Euclidean distance (or free distance) associated with the code.

Figures 1, 4:
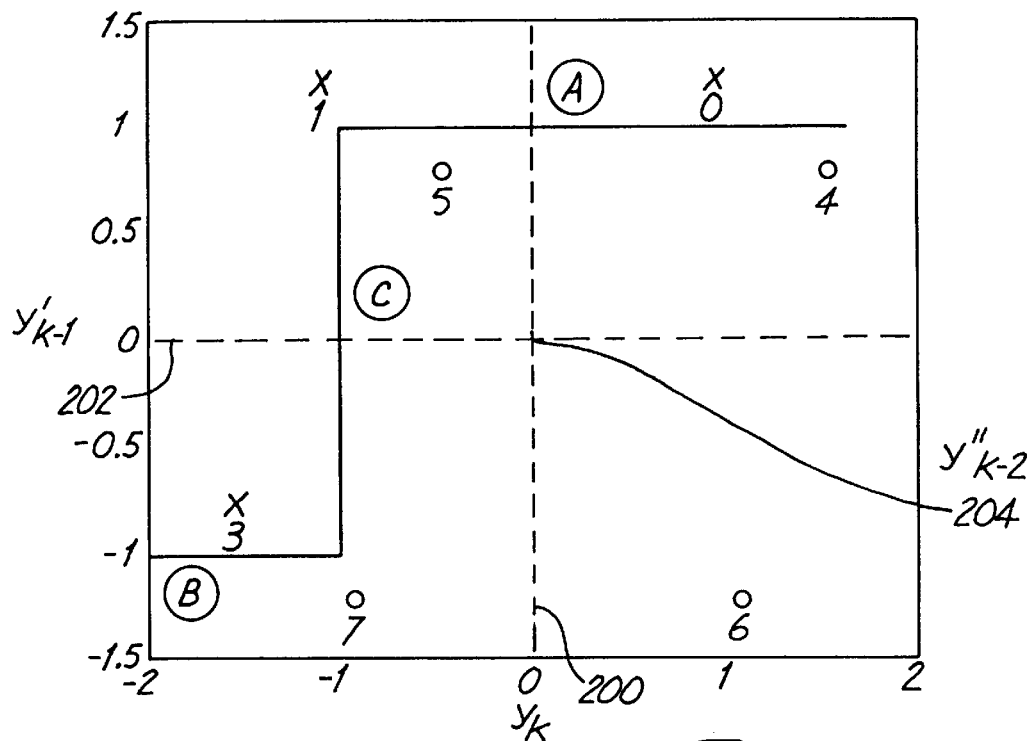
Figures 2, 4:
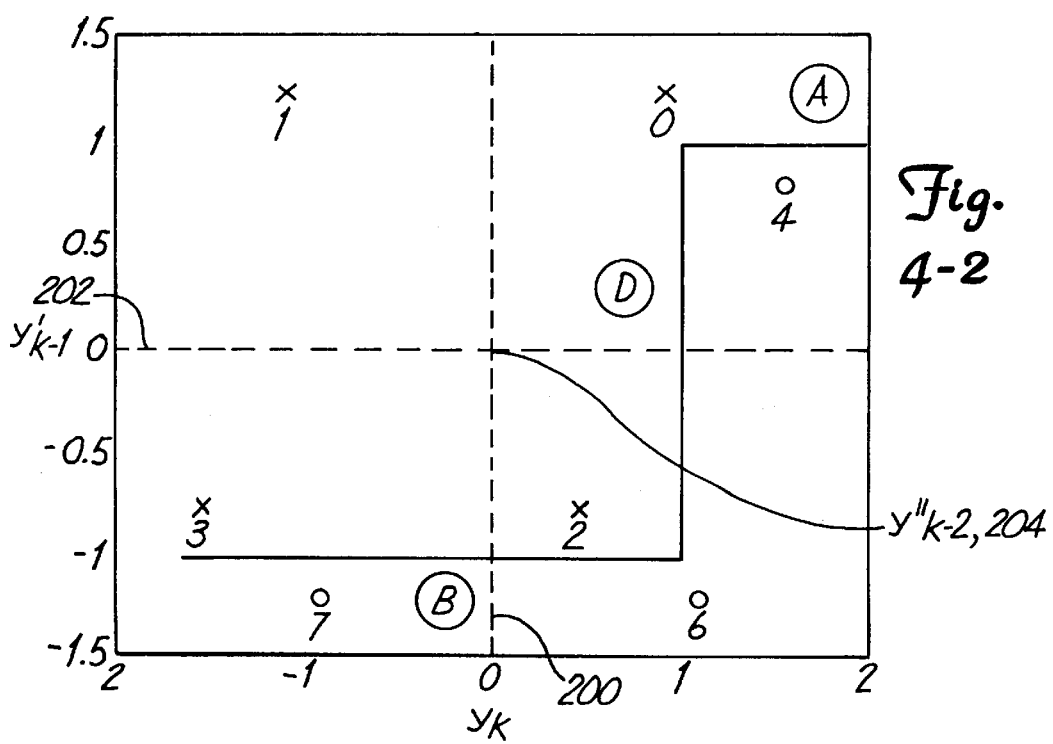

FIGS. 4-1 and 4-2 illustrate a vector space for a detector which analyzes an input sequence having three terms which constitute an observation vector. More specifically, FIGS. 4-1 and 4-2 illustrate symbol constellations of a Lorentzian channel at symbol density of 2.25. The constellations have axes $y_k$ (also designated by numeral 200) and $y'_{k-1}$ (also designated by numeral 202). The constellations shown in FIGS. 4-1 and 4-2 also include a third axis $y''_{k-2}$ (which is also designated by the number 204). Axis $y''_{k-2}$ extends into and out of the plane of the paper containing FIGS. 4-1 and 4-2.

As will be described, some symbols are removed based on the MTR constraint, and all of the possible remaining symbols which could represent the three-dimensional observation vector are mapped to the constellations illustrated in FIGS. 4-1 and 4-2. Planar boundaries are then constructed to divide those symbols in the three-dimensional space defined by the constellations. The observation vector is then mapped to the constellation and the detector provides a decision based upon where the observation vector resides in the constellation relative to the planar boundaries.

The axes of the constellations are defined as follows:

$$y_k = a_k + f_1 a_{k-1} + f_2 a_{k-2} \quad \text{Equation 2}$$

$$y'_{k-1} = a_{k-1} + f_1 a_{k-2} \quad \text{Equation 3}$$

$$y''_{k-2} = a_{k-2} \quad \text{Equation 4}$$

where $y'_{k-1}$ and $y''_{k-2}$ denote the detector inputs at times k−1 and k−2 with the intersymbol interference due to the available past decisions (i.e., the decisions for $â_{k-3}$ and $â_{k-4}$ at time k) cancelled. Decision device 172 must make a decision on the input bit $a_{k-2}$ (i.e., the input bit which was received two time intervals previously) at each time k in the detection process because the detector is processing three input bits as an observation vector.

TABLE 1

| Index | ($a_{k-2}$, $a_{k-1}$, $a_k$) | ($y_k$, $y'_{k-1}$, $y''_{k-2}$) |
|---|---|---|
| 0 | (+1, +1, +1) | (+1 + $f_1$ + $f_2$, +1 + $f_1$, +1) |
| 1 | (+1, +1, −1) | (−1 + $f_1$ + $f_2$, +1 + $f_1$, +1) |
| 2* | (+1, −1, +1) | (+1 − $f_1$ + $f_2$, −1 + $f_1$, +1) |
| 3 | (+1, −1, −1) | (−1 − $f_1$ + $f_2$, −1 + $f_1$, +1) |
| 4 | (−1, +1, +1) | (+1 + $f_1$ − $f_2$, +1 − $f_1$, −1) |
| 5* | (−1, +1, −1) | (−1 + $f_1$ − $f_2$, +1 − $f_1$, −1) |
| 6 | (−1, −1, +1) | (+1 − $f_1$ − $f_2$, −1 − $f_1$, −1) |
| 7 | (−1, −1, −1) | (−1 − $f_1$ − $f_2$, −1 − $f_1$, −1) |

Table 1 illustrates all possible input sequences which could be represented by the observation vector. Table 1 includes an index which refers to an index numeral 0–7 corresponding to the $2^n$ (where n=3) possible symbols. Table 1 also includes the possible symbols written out in terms of $a_{k-2}$, $a_{k-1}$ and $a_k$, and also provides an evaluation of the axis $y_k$, $y'_{k-1}$ and $y''_{k-2}$ written in terms of the channel response.

FIGS. 5-1 and 5-2 illustrate waveforms 206, 208, 210 and 212 which represent dominant error events observed for MLSD detectors at high densities and high order partial response targets. In FIG. 5-1, waveform 206 represents a tribit, while waveform 208 represents the same tribit shifted by one time interval. This has been observed to represent a dominant error event. In FIG. 5-2, waveform 210 represents a quadbit while waveform 212 represents a dibit. It has been observed that such detectors incorrectly detect a quadbit where a dibit was the actual value, and vice versa. This also represents a dominant error event.

In order to eliminate such dominant error events, the input data is preferably encoded according to an MTR=2 constraint which disallows tribits. Thus, in Table 1, either symbol 2 or symbol 5 must be disallowed, depending upon the value of $â_{k-3}$, since those symbols represent the presence of a tribit. For example, with $â_{k-3}=+1$, symbol 5 corresponds to a sequence of input bits of the form $(+1, -1, +1, -1)$ which contains three consecutive transitions and must be eliminated. By the same token, where $â_{k-3}=-1$, symbol 2 must be eliminated.

The constellation shown in FIG. 4-1 has all is possible symbols mapped thereto, assuming $â_{k-3}=-1$. Note that symbol 2 is not mapped to the constellation shown in FIG. 4-1. Similarly, the constellation shown in FIG. 4-2 has all of the possible symbols mapped thereto where $â_{k-3}=+1$. Note that symbol 5 has been eliminated.

The symbols corresponding to $y''_{k-2}=+1$ and $-1$ are denoted by x's and 0's, respectively. The index number is denoted below the symbol marker x's and 0's.

FIGS. 4-1 and 4-2 also illustrate slicer planes A, B, C and D which are used to divide the various symbols mapped to the constellations. Initially, it is noted that four slicer planes are used. However, as will be described, in order to simplify the detector structure, the number of planes is limited to three (e.g., planes C and D are combined to form a new plane E discussed below). In order to further simplify the detector structure, the directions of the planes are also constrained.

Plane A is provided to separate symbols 0 and 4 (and also symbols 1 and 5 in FIG. 4-1). For an optimal detector, the decision boundaries are planes which bisect a line which connects the pairs of symbols being separated. However, for simplicity, the system is constrained to locate the plane not to separate the two symbols in three-dimensional space, but to separate their projections on the $y'_{k-1} y''_{k-2}$ surface. This constraint is implemented by picking the two coordinates which contribute most heavily to the distance between the two symbols. It can be seen that the $y''_{k-2}$ coordinate should be retained since the two symbols which correspond to different decisions on the input bit $a_{k-2}$ are easily separated on this axis. Of the remaining two coordinates (and except for very low symbol densities), the $y'_{k-1}$ coordinate contributes more heavily to the distance than the $y_k$ coordinate. Thus, the symbols are projected to the $y'_{k-1} y''_{k-2}$ surface. Slicer plane A is thus constrained to only rotate perpendicular to the $y'_{k-1} y''_{k-2}$ surface.

The projection of plane A onto the chosen surface is thus represented as a line whose direction changes as the slicer plane is allowed to rotate. All points on the line have the same distance from the projected pair of symbols.

From Table 1, it can be seen that the coordinates of the projections of symbols 0 and 4 on the $y'_{k-1} y''_{k-2}$ surface are given by $(1+f_1, +1)$ and $(1-f_1, -1)$, respectively. Thus, the equation of plane A can be obtained as follows:

$$(y'_{k-1} - (1+f_1))^2 + (y''_{k-2} - 1)^2 = \quad \text{Equation 5}$$
$$(y'_{k-1} - (1-f_1))^2 + (y''_{k-2} + 1)^2$$

This expression can be simplified to yield:

$$y''_{k-2} + f_1 y'_{k-1} - f_1 = 0 \quad \text{Equation 6}$$

Using a similar procedure, the equation for slicer plane B which separates symbols 3 and 7 (and also symbols 2 and 6 in FIG. 4-2) can be written as follows:

$$y''_{k-2} + f_1 y'_{k-1} + f_1 = 0 \quad \text{Equation 7}$$

When $â_{k-3}=-1$, plane C separates symbols 3 and 5. Plane C is constrained to only rotate perpendicular to the $y_k y''_{k-2}$ surface since the coordinates which contribute most heavily to the distance between the symbols are the coordinates corresponding to the $y_k$ and $y''_{k-2}$ axes. The plane equation is derived by finding a line which bisects the projections of the two symbols onto the $y_k y''_{k-2}$ surface.

The operation is again repeated for plane D which separates symbols 2 and 4 when $â_{k-3}=+1$.

These procedures result in the following four boundary plane equations:

A: sgn $(y''_{k-2} + f_1 y'_{k-1} - f_1)$      Equation 8

B: sgn $(y''_{k-2} + f_1 y'_{k-1} - f_1)$      Equation 9

C: sgn $(y''_{k-2} - f_1 - f_2)\, y_k - (f_1 - f_2))$      Equation 10 where $â_{k-3}=-1$

D: sgn $(y''_{k-2} - (f_1 - f_2)\, y_k + (f_1 - f_2))$      Equation 11 where $â_{k-3}=+1$

Boundaries C and D can also be combined to provide:

E: sgn $(y''_{k-2} - (f_1 - f_2)\, y_k + (f_1 + f_2)\, â_{k-3})$      Equation 12

Equation 12 can be further simplified by setting $(f_1 - f_2) = 1$. This simplification has a negligible effect on the detector performance since at lower channel densities of interest, the two symbols to be separated by this plane are further apart than those separated by planes A and B. Therefore, a slight change in the plane orientation and position does not impact a relative location of the received samples with respect to this plane. Thus, Equation 12 can be simplified as follows:

E: sgn $(y''_{k-2} - y_k + â_{k-3})$      Equation 13

By substituting for $y'_{k-1}$ and $y''_{k-2}$ from Equations 3 and 4, the following relations are obtained for the three boundary planes:

A: sgn $(y_{k-2} + f_1 y_{k-1} + \Delta A)$      Equation 14

B: sgn $(y_{k-2} + f_1 y_{k-1} + \Delta B)$      Equation 15

E: sgn $(y_{k-2} - y_k + \Delta E)$      Equation 16 where values $\Delta A$, $\Delta B$ and $\Delta E$ are offset values given by:

$\Delta A = (-f_1 - f_1 f_2)\, â_{k-3} - f_2\, â_{k-4} - f_1$      Equation 17

$\Delta B = (-f_1 - f_1 f_2)\, â_{k-3} - f_2\, â_{k-4} - f_1$      Equation 18

$\Delta E = (-f_1 + 1)\, â_{k-3} - f_2\, â_{k-4}$      Equation 19

The offset values, in general, are implemented as short FIR filters with binary inputs, two input multiplexers, or look up tables.

Decision logic can be implemented by moving a test point through the three-dimensional signal space and recording the relative position of the point with respect to the planes. The corresponding detector output is obtained by finding the closest symbol in the constellation to the test point. A logic rule is then obtained by combining the cases which result in the same output decision from the detector. However, for the three-dimensional case discussed herein, the logic rule can simply be obtained by inspection. Mapping the boundary decisions −1 to 0, the logic rule can be written as follows:

$$\hat{a}_{k-2} = B \cdot E + A \qquad \text{Equation 20}$$

where . denotes a logical AND operation and + denotes a logical OR operation.

Figure 6:
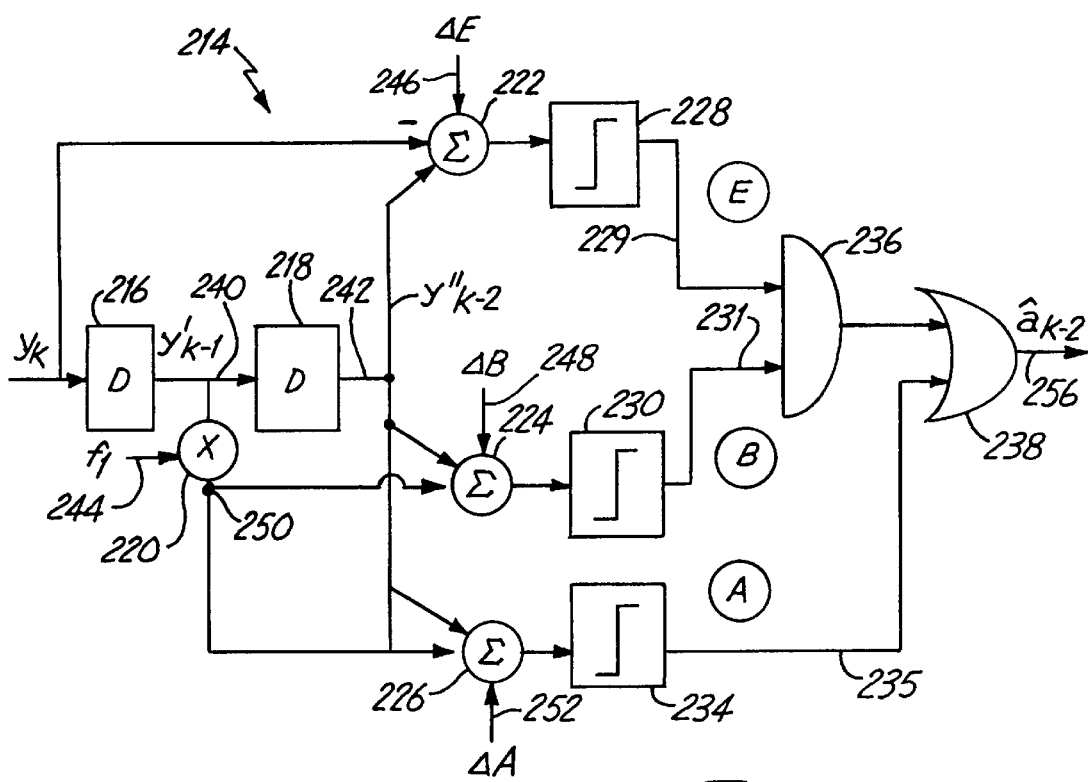
FIG. 6 is a block diagram illustrating a detector architecture of a detector in accordance with one aspect of the present invention.

FIG. 6 is an architectural block diagram illustrating a 3D-SSD detector 214 in accordance with one aspect of the present invention. Detector 214 includes delay operators 216 and 218, multiplier 220, summing circuits 222, 224, and 226, slicers 228, 230, 234, AND circuit 236 and OR circuit 238. As illustrated in FIG. 6, $y_k$ is provided to delay operator 216 which provides, at its output 240, $y'_{k-1}$. That term is also provided to delay operator 218 which provides at its output 242, $y''_{k-2}$. Multiplier 220 receives at its input 244, $f_1$. Summing circuit 222 receives at one input 246 thereof the offset value $\Delta E$ and at the other two inputs thereof $y_k$ and $y''_{k-2}$. Summing circuit 224 receives at one input 248 thereof offset value $\Delta B$ and at the other two inputs thereof the output 250 of multiplier 220 and also $y''_{k-2}$. Summing circuit 226 receives, at a first input 252 thereof the offset value $\Delta A$ and at its other inputs the output 250 from multiplier 220 and $y''_{k-2}$ from delay operator 218. The output of summing circuits 222, 224 and 226 are provided to slicers 228, 230 and 234, respectively. The outputs 229, 231 and 235 of slicers 228, 230 and 234 are to circuits 236 and 238 as shown. The output 256 of circuit 238 provides $\hat{a}_{k-2}$. Thus, detector 214 uses one multiplier, there slicers, three adders and three two input multiplexers. A similar 3D-110 detector can be implemented using three slicers, three adders and two-input multiplexers.

In the above discussion, detector 214 was constructed by taking advantage of the fact that, at each time interval, only one of the two symbols 2 or 5 from Table 1 is present in the signal space constellation. This is because the MTR=2 code removes one of the two symbols at all times.

However, the dominant error events mentioned with respect to FIGS. 5-1 and 5-2 can also be removed using a time-variant transition run constraint. Such a constraint allows tribits, but only allows them to start at predetermined intervals. In one embodiment, the time-variant transition run constraint allows tribits to start only at every other (i.e., even or odd) numbered time intervals. This type of relaxed constraint allows the development of codes with higher rates. Thus, with the time variant MTR code, it is possible to have both symbols 2 and 5 present in the signal constellation at every other time interval. In order to implement the 3D detectors in accordance with the present invention, modifications must be made in order to accommodate the change in the code constraint.

Figures 1, 7:
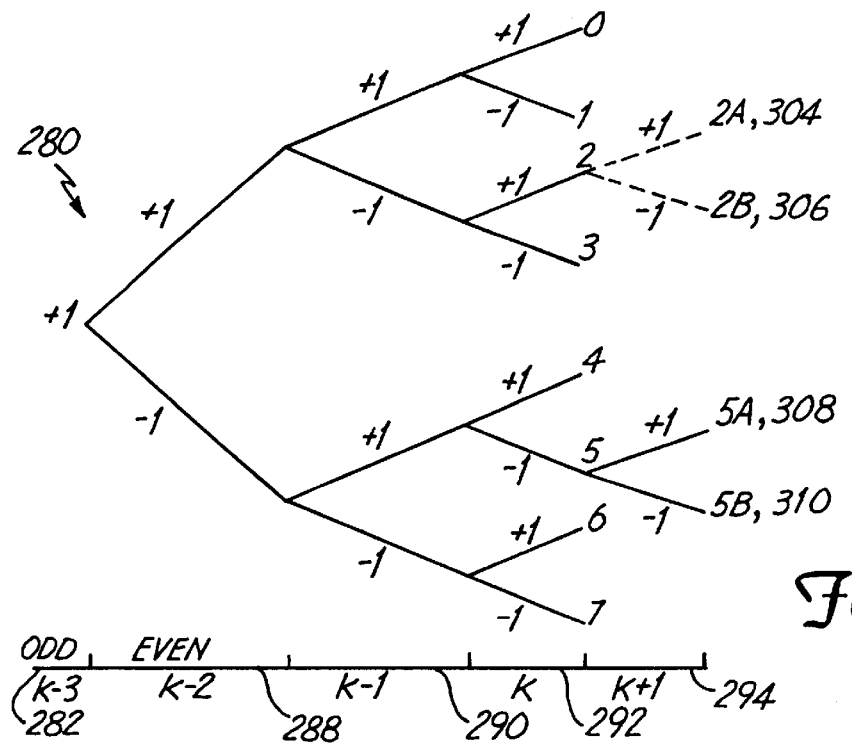
Figures 2, 7:
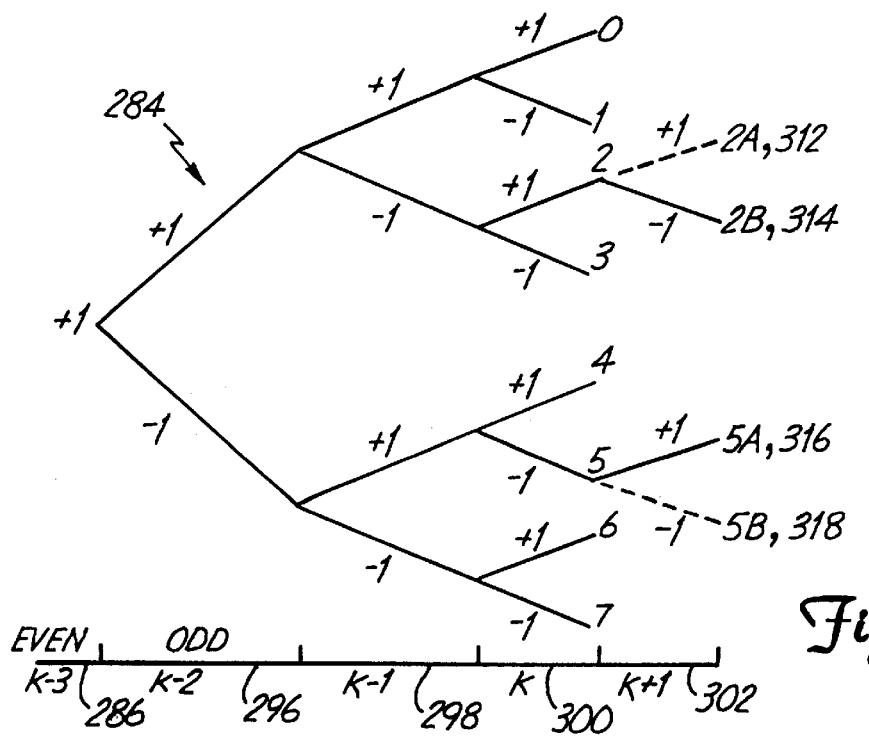

In order to better understand the modifications required to detect data encoded according to a code having the time-variant code constraint, a signal space detector in accordance with the percent invention can be understood with reference to an FDTS/DF tree of depth 2. FIG. 7-1 illustrates such a tree 280 where the tree has a root beginning at an odd time interval k−3 (also designated by numeral 282). FIG. 7-2 illustrates such a tree 284 having a root which begins at an even time interval k−3 (also designated 286). Trees 280 and 286 both assume that $\hat{a}_{k-3} = +1$.

Without any loss of generality, the present discussion proceeds under the assumption that tribits are only allowed to start at even time intervals. While the root of trees 280 and 284 illustrate the value of $a_{k-3}$, the subsequent branches which proceed from left to right along the tree illustrate the value of samples $a_{k-2}$, $a_{k-1}$, $a_k$ and $a_{k+1}$. The corresponding time intervals are illustrated along the bottom of each tree and are designated, in FIG. 7-1, by numerals 288, 290, 292 and 294 and in FIG. 7-2 by numerals 296, 298, 300 and 302.

By examining trees 280 and 284, it can be seen that either path 2 or path 5 will be disallowed since one of them violates the code constraint. For example, in FIG. 7-1, path 5 can be pruned from the tree since it reveals a tribit pattern (+1, −1, +1, −1) which starts at an odd time interval. Therefore, where the root corresponds to an odd time interval, that situation is identical to the MTR=2 in the previously described detector. On the other hand, as shown in FIG. 7-2, where the root corresponds to an even time interval (and where tribits are allowed to start at even time intervals) both branches 2 and 5 are permitted.

In order to realize the coding gain for an FDTS/DF(2) detector with a time-variant MTR code, the problematic path can be removed at odd times and restored at even times. However, the presence of both paths 2 and 5 increases the chance of an erroneous section of trees 280 or 284 to be selected. In fact, as user densities increase, these errors begin to become so large that they eliminate the code-rate benefit of the time-variant MTR code.

Therefore, in accordance with one aspect of the present invention, branches 2 and 5 are extended one step further in time (beyond time interval k). Such extensions are labeled 2A, 2B, 5A and 5B in FIGS. 7-1 and 7-2 and are also indicated by designation numerals 304, 306, 308, 310, 312, 314, 316 and 318. Extension of paths 2 and 5 does not affect pruning of the branches as illustrated in FIG. 7-1. Path 2 is still allowed and path 5 is still disallowed. However, in FIG. 7-2, extension of the paths one extra time interval allows the pruning of branch 2B. In other words, branch 2A is still allowed in FIG. 7-2 because it does not violate the time-variant MTR code constraint. However, branch 2B does violate the code constraint because it represents a tribit beginning at an odd time interval. Similarly, branch 5B in FIG. 7-2 is allowed, while branch 5A can be eliminated.

The remaining symbols, after pruning, in FIG. 7-2 which are represented by path 2A and path 5B correspond to an error event of the form ±(2, −2, 2, 2). Thus, the distance between these two symbols should be considerably greater than the minimum Euclidean distance for the code.

Using this technique, a 4-dimensional observation vector, which includes $a_{k-2}$, $a_{k-1}$, $a_k$ and $a_{k+1}$ can be used to further prune the tree. The four-dimensional observation vector is compared to the remaining two symbols corresponding to paths 2A and 5B and the closer of those two symbols to the four-dimensional observation vector is retained while the other is pruned from the tree. Removal of one of the two symbols, then, enables the implementation of a signal constellation which resembles those in FIGS. 4-1 and 4-2.

In order to implement such a detector as a signal space detector, a boundary plane must be developed which can be used in rendering a boundary decision for the selection of either path 2A or 5B in FIG. 7-2. The sample at time k+1 can be written as follows;

$$y_{k+1} = a_{k+1} + f_1\, a_k + f_2\, a_{k-1} \qquad \text{Equation 21}$$

In the new four-dimensional signal space ($y_{k+1}$, $y_k$, $y'_{k-1}$, $y''_{k-2}$) symbols 2A and 5B are given by (+1, +$f_1$−$f_2$, +1−$f_1$+$f_2$, −1+$f_1$, +1) and (−1−$f_1$+$f_2$, −1+$f_1$−$f_2$, 1−$f_1$, −1), respectively. A new boundary plane P bisects the projection of these points onto the $y_{k+1}$ $y''_{k-2}$ surface.

Assuming the sample $y_{k+1}$ is available at time interval k, the equation of plane P can be obtained by writing the distance of the point $(y_{k+1}, y''_{k-2})$ from the two points which represent symbols 2A and 5B as follows:

$$(y_{k+1} - (1+f_1-f_2))^2 + (y''_{k-2}-1)^2 = \qquad \text{Equation 22}$$
$$(y_{k+1} - (-1-f_1+f_2))^2 + (y''_{k-2}+1)^2$$

The selection of one of points 2A and 5B due to plane B only impacts the symbol constellation at even times (i.e., when k–3 is even), since it removes either symbol 2 or symbol 5. In order to alleviate the computational delay due to this boundary, the decision is preferably obtained one time interval early. Thus, Equation 22 can be rewritten to reflect the fact that the decision is obtained one time interval earlier, as follows:

$$(y_{k+2} - (1+f_1-f_2))^2 + (y''_{k-1}-1)^2 = \qquad \text{Equation 23}$$
$$(y_{k+2} - (-1-f_1+f_2))^2 + (y''_{k-1}+1)^2$$

However, difficulty still arises. Computation of $y_{k+2}$ at time k requires the availability of the sequence $(\hat{a}_{k-1}, \hat{a}_{k-2}, \ldots, \hat{a}_{k-N})$ for feedback cancellation where N is the length of the feedback filter, but the $\hat{a}_{k-1}$ and $\hat{a}_{k-2}$ decisions are not yet available at time k. Thus, an additional parameter $z_k$ is defined where the intersymbol interference due to the feedback taps $f_3$ and $f_4$ are not yet subtracted, as follows:

$$z_{k+2} = y_{k+2} + f_3 \hat{a}_{k-1} + f_4 \hat{a}_{k+2} \qquad \text{Equation 24}$$

Figure 8:
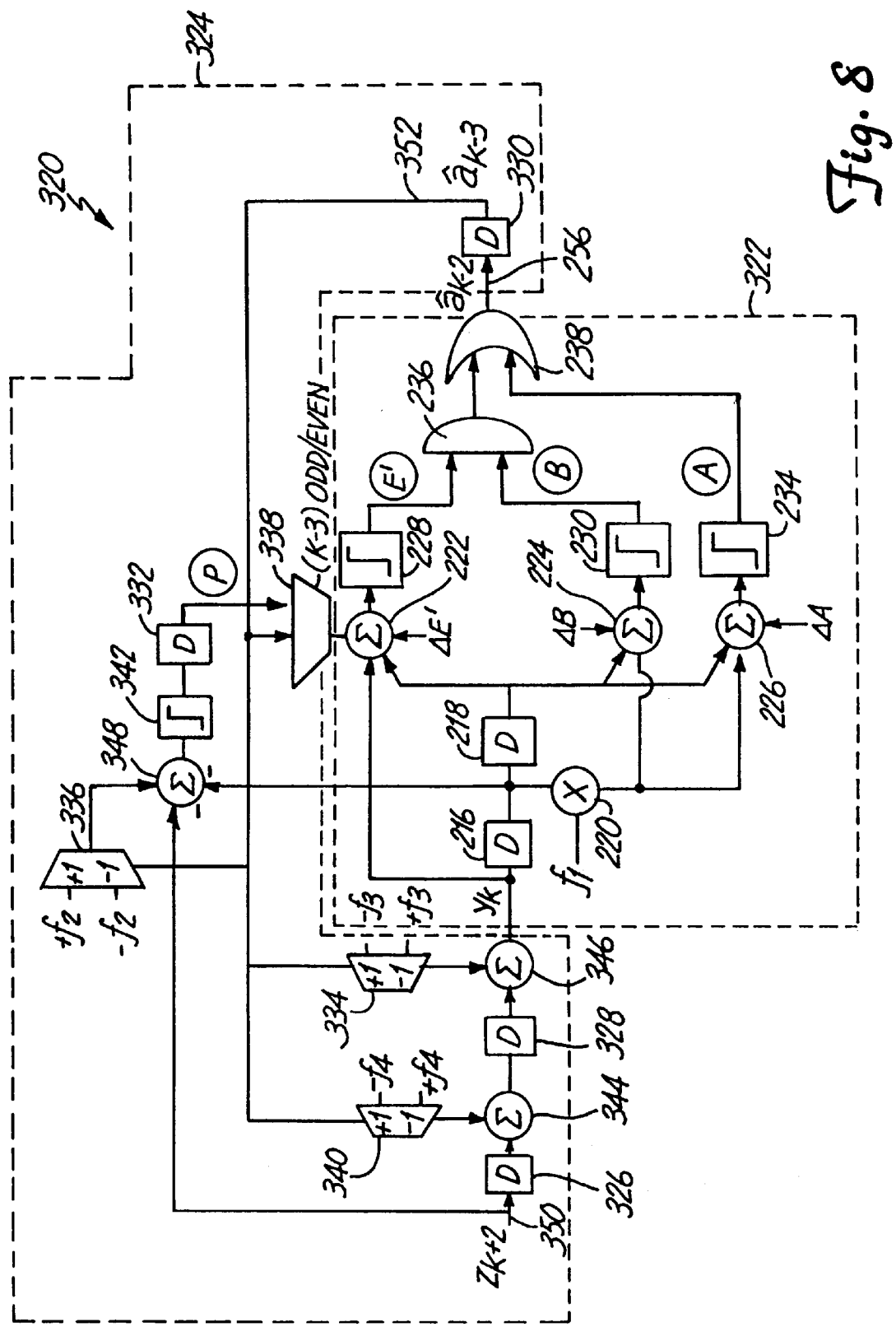
FIG. 8 is a block diagram showing a detector architecture of a detector in accordance with one aspect of the present invention.

For each of the symbols, the values for $\hat{a}_{k-1}$ and $\hat{a}_{k-2}$ can be taken directly from the path leading to that symbol. For example, the LHS of Equation 22 denotes the distance from symbol 2A for which $\hat{a}_{k+1} = -1$ and $\hat{a}_{k-2} = +1$, as shown in FIG. 8-2. On the other hand, for symbol 5B (i.e., the RHS of Equation 22), $\hat{a}_{k-1} = +1$ and $\hat{a}_{k-2} = -1$. This operation is similar to local feedback cancellation such as that used in reduced state sequence estimators (RSSE). Similarly, local feedback is also used for the value of $\hat{a}_{k-2}$ when $y''_{k-1}$ is transformed back to $y_{k-1}$. Substituting for $y_{k+2}$ in Equation 23, and using local feedback values for $\hat{a}_{k-1}$ and $\hat{a}_{k-2}$ yields the following planar equation:

$$(-1+(f_2+f_3-f_4)/(1+f_1)) Z_{k+2} - y_{k-1} + f_2 \hat{a}_{k-3} = 0 \qquad \text{Equation 25}$$

Since the distance between symbols 2A and 5B is much greater than the minimum Euclidean distance, the multiplicative factor of $z_{k+2}$ can be set to –1, with negligible impact on performance. Therefore, slicer plane P can be given by:

$$P: \text{sgn} (-z_{k+2} - y_{k-1} + f_2 \hat{a}_{k-3}) \qquad \text{Equation 26}$$

As mentioned above, by providing the decision due to plane P at even time intervals, the symbol constellation for the remainder of the detector is made similar to those shown in FIGS. 4-1 and 4-2, and the modified 3D-SSD detector in accordance with the present invention can be implemented. While the equations for all four planes A, B, C and D remain unchanged, the conditions under which planes C and D are applied needs to be somewhat modified. The constellation illustrated in FIG. 4-1 and the boundary of plane C apply when $\hat{a}_{k-3} = -1$ with the root at an odd time interval or when P=–1 with the root at an even time interval. On the other hand, the constellation illustrated in FIG. 4-2 and the boundary plane D are applicable when $\hat{a}_{k-3} = +1$ at odd time intervals or when P=+1 at even time intervals. This can be summarized by the following notation:

C: sgn $(y''_{k-2} - y_k - 1)$, $\hat{a}_{k-3} = -1$ (odd) or P=–1 (even)   Equation 27

D: sgn $(y''_{k-2} - y_k + 1)$, $\hat{a}_{k-3} = +1$ (odd) or P=+1 (even)   Equation 28

Again, the two planes can be combined to provide plane E' as follows:

$$L': \begin{array}{l} y_{k-2} - y_k - \Delta E' + \hat{a}_{k-3}, \\ y_{k-2} - y_k - \Delta E' + P \end{array} \qquad \text{Equation 29}$$

where $\Delta E' = -f_1 \hat{a}_{k-3} - f_2 \hat{a}_{k-4}$. $\Delta E'$ can, of course, again be implemented as a FIR filter or a two-input multiplexer. The final decision is again rendered by Equation 20.

FIG. 8 is an architectural block diagram which illustrates a detector 320 in accordance with one aspect of the present invention. Detector 320 includes a first portion 322 which is similar to detector 214 illustrated in FIG. 6, and similar items are similarly numbered. However, detector 320 also includes a second detector portion 324. Detector portion 324 is configured to implement boundary plane P derived above. Detector portion 324 includes delay operators 326, 328, 330 and 332, two input multiplexers 334, 336, 338 and 340, slicer 342 and summing circuits 344, 346 and 348.

Two input multiplexers 334, 336, and 340 provide one of the designated inputs, at their outputs, based on whether $\hat{a}_{k-3}$ is +1 or –1. Delay operator 326 receives at its input 350 the value $z_{k+2}$. Therefore, delay operators 326 and 328, summing circuits 344 and 346, and multiplexers 334 and 340 combine to provide $y_k$ to the input of delay operator 216.

In addition, delay operator 330 receives $\hat{a}_{k-2}$ as output 256 from circuit 238 and provides, at its output 352 the value $\hat{a}_{k-3}$. This value is provided as feedback to the remainder of the circuit. Further, multiplexer 336, summing circuit 338, slicer 342 and delay operator 332 operate to provide slicer plane P to one input of multiplexer 338. The other input of multiplexer 338 is coupled to $\hat{a}_{k-3}$. Multiplexer 338 provides either plane P or $\hat{a}_{k-3}$ to summing circuit 222 based on whether k–3 is even or odd.

Thus, it can be seen that the present invention implements a signal space detector for MTR-coded channels. Since no constraint is enforced on the channel response, the detectors can be used over a wide user density range. Also, signal space detector is implemented in accordance with the present invention with an MTR=2 constraint as well as time-variant MTR codes. With the MTR=2 code, the detector provides a significant gain over the 3D-110 detector at lower user densities. The performance is further improved with a time variant MTR code of higher rate, especially at higher densities.

The present invention includes a detector 320 for detecting data read from a disc 112 in a disc drive 110. The data is provided in a sampled read signal including data samples provided in a plurality of time periods. The data is encoded according to a code having a time varying maximum transition run constraint which varies between a first constraint and a second constraint periodically over a plurality of time intervals. The detector 320 includes a first detector portion 322 configured to determine a placement of data samples, each having a first plurality of terms, relative to a first plurality of planes in a multi-dimensional space when a data sample then being detected is constrained according to the first constraint. The detector also includes a second portion 324 configured to determine a placement of data samples, each having an additional term, relative to at least one additional plane in the multi-dimensional space when the data sample then being detected is constrained according to the second constraint.

In one embodiment, the first detector portion 322 is configured to detect which one of a first plurality of possible symbols, in the multi-dimensional space, the data sample then being detected corresponds to based on placement of the data sample relative to the first plurality of planes in the multi-dimensional space. In one illustrative embodiment, the first plurality of terms comprises N terms and the first plurality of possible symbols comprises a subset of all $2^N$ possible symbols. This subset is reduced over the $2^N$ symbols based on the first constraint when the data sample then being detected is constrained by the first constraint.

In one preferred embodiment, the second plurality of terms comprises N+1 terms. The second detector portion 324 is configured to detect which of the $2^N$ possible symbols are to be eliminated to obtain the subset based on the second constraint and based on the placement of the data sample then being detected relative to the at least one additional plane in the multi-dimensional space.

In accordance with an illustrative embodiment, the first detector portion 322 includes an output portion 238 configured to provide an estimate of the data sample then being detected based on the placement of the data sample relative to the first plurality of planes. In the illustrative embodiment, the output portion 238 is configured to provide the estimate of the data sample as the one of the possible symbols the data sample corresponds to.

The present invention can also be implemented as a method wherein the signal space detector 320 receives an input sample, including a first plurality of terms, indicative of one of a first plurality of possible data symbols. The detector 320 eliminates one of the first plurality of possible data symbols, based on the first constraint when the input sample then being detected is constrained by the first constraint, to provide a second plurality of remaining possible data symbols. The detector 320 determines an estimated data value corresponding to the output sample then being detected by determining which of the second plurality of remaining possible data symbols is within a predetermined range of the input symbol.

In one illustrative embodiment, the receiving step includes receiving a second input sample including an additional term when the input sample then being detected is constrained by the second constraint. The eliminating step includes eliminating, for the second input sample, one of the first plurality of possible data symbols based on the second constraint and based on which of the subset of the plurality of data symbols is within a predetermined range of the second input sample.

In yet another illustrative embodiment, the determining step includes determining placement of the input sample relative to a first plurality of planes in a multi-dimensional space wherein the first plurality of planes divides the second plurality of remaining possible data symbols in the multi-dimensional space. The determining step also includes determining which of the second plurality of remaining possible data symbols corresponds to the input sample based on the placement of the input sample relative to the plurality of planes in the multi-dimensional space.

In another illustrative embodiment, the eliminating step includes determining placement of the second input sample relative to at least one additional plane in the multi-dimensional space, and eliminating the one of the first plurality of possible data symbols based on the placement of the second input sample relative to the at least one additional plane in the multi-dimensional space. Further, the determining step includes determining placement of the second input sample relative to the first plurality of planes in the multi-dimensional space wherein the first plurality of planes divides the second plurality of remaining possible data symbols in the multi-dimensional space, and determining which of the second plurality of remaining possible data symbols corresponds to the second input sample based on the placement of the second input sample relative to the plurality of planes in the multi-dimensional space.

The present invention can also be implemented as a signal space detector configured to perform the above-mentioned steps.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular partial response target and MTR code while maintaining substantially the same functionality without departing from the scope and spirit of the present invention.

What is claimed is:

1. A detector for detecting data read from a disc in a disc drive and provided as a sampled read signal including data samples provided in a plurality of time periods, the data being encoded according to a code having a time varying maximum transition run constraint which varies between a first constraint and a second constraint periodically over a plurality of time intervals, the detector comprising:

a first detector portion configured to determine a placement of data samples, each having a first plurality of terms, relative to a first plurality of planes in a multi-dimensional space when a data sample then being detected is constrained according to the first constraint; and a second detector portion configured to determine a placement of data samples, each having an additional term, relative to at least one additional plane in the multi-dimensional space when the data sample then being detected is constrained according to the second constraint.

2. The detector of claim 1 wherein the first detector portion is configured to detect which one of a first plurality of possible symbols, in the multi-dimensional space, the data sample then being detected corresponds to based on placement of the data sample relative to the first plurality of planes in the multi-dimensional space.

3. The detector of claim 2 wherein the first plurality of terms comprises N terms and wherein the first plurality of possible symbols comprises a subset of all $2^N$ possible symbols, the subset being reduced over the $2^N$ possible symbols based on the first constraint when the data sample then being detected is constrained by the first constraint.

4. The detector of claim 3 wherein the second plurality of terms comprises N+1 terms and wherein the second detector portion is configured to detect which of the $2^N$ possible symbols are to be eliminated to obtain the subset based on the second constraint and based on the placement of the data sample then being detected relative to the at least one additional plane in the multi-dimensional space.

5. The detector of claim 4 wherein the first detector portion further comprises:

an output portion configured to provide an estimate of the data sample then being detected based on the placement of the data sample relative to the first plurality of planes.

6. The detector of claim 5 wherein the output portion is configured to provide the estimate of the data sample as the one of the plurality of possible symbols the data sample corresponds to.

7. A method of detecting data read from a disc in a disc drive and provided as a sampled read signal including data samples provided in a plurality of time intervals, the method comprising the steps of:

providing a signal space detector configured to detect the data wherein the data is encoded according to a code having a time varying maximum transition run constraint which varies between a first and a second constraint over a plurality of time intervals, the signal space detector being configured to perform steps of:
(a) receiving an input sample, including a first plurality of terms, indicative of one of a first plurality of possible data symbols;
(b) eliminating one of the first plurality of possible data symbols, based on the first constraint when the input sample then being detected is constrained by the first constraint, to provide a second plurality of remaining possible data symbols; and
(c) determining an estimated data value corresponding to the input sample then being detected by determining which of the second plurality of remaining possible data symbols is within a predetermined range of the input symbol.

8. The method of claim 7 wherein the receiving step (a) comprises the step of:

(a)(i) receiving a second input sample including an additional term when the input sample then being detected is constrained by the second constraint.

9. The method of claim 8 wherein the eliminating step (b) comprises the step of:

(b) (i) eliminating, for the second input sample, one of the first plurality of possible data symbols based on the second constraint and based on which of a subset of the first plurality of data symbols is within a predetermined range of the second input sample.

10. The method of claim 9 wherein the determining step (c) comprises the step of:

(c) (i) determining placement of the input sample relative to a first plurality of planes in a multi-dimensional space wherein the first plurality of planes divides the second plurality of remaining possible data symbols in the multi-dimensional space; and
(c) (ii) determining which of the second plurality of remaining possible data symbols corresponds to the input sample based on the placement of the input sample relative to the plurality of planes in the multi-dimensional space.

11. The method of claim 10 wherein the eliminating step (b) (i) comprises the steps of:

(b) (i) (1) determining placement of the second input sample relative to at least one additional plane in the multi-dimensional space; and
(b) (i) (2) eliminating the one of the first plurality of possible data symbols based on the placement of the second input sample relative to the at least one additional plane in the multi-dimensional space.

12. The method of claim 11 wherein the determining step (c) comprises:

(c) (iii) determining placement of the second input sample relative to the first plurality of planes in the multi-dimensional space wherein the first plurality of planes divides the second plurality of remaining possible data symbols in the multi-dimensional space; and
(c) (ii) determining which of the second plurality of remaining possible data symbols corresponds to the second input sample based on the placement of the second input sample relative to the plurality of planes in the multi-dimensional space.

13. A signal space detector for detecting data read from a disc in a disc drive and provided as a sampled read signal including data samples provided in a plurality of time intervals, the data being encoded according to a code having a time varying maximum transition run constraint which varies between a first and a second constraint over the plurality of time intervals, the signal space detector being configured to perform steps of:

(a) receiving an input sample including a first plurality of terms and being indicative of one of a first plurality of possible data symbols;
(b) eliminating one of the first plurality of possible data symbols, based on the first constraint when the input sample then being detected is constrained by the first constraint to provide a second plurality of remaining possible data symbols; and
(c) determining an estimated data value corresponding to the input sample then being detected by determining which of the second plurality of remaining possible data symbols is within a predetermined range of the input symbol.

14. The signal space detector of claim 13 wherein the receiving step (a) comprises the step of:

(a) (i) receiving a second input sample including an additional term when the input sample then being detected is constrained by the second constraint.

15. The signal space detector of claim 14 wherein the eliminating step (b) comprises the step of:

(b) (i) eliminating, for the second input sample, one of the first plurality of possible data symbols based on the second constraint and based on which of a subset of the first plurality of data symbols is within a predetermined range of the second input sample.

16. The signal space detector of claim 15 wherein the determining step (c) comprises the step of:

(c) (i) determining placement of the input sample relative to a first plurality of planes in a multi-dimensional space wherein the first plurality of planes divides the second plurality of remaining possible data symbols in the multi-dimensional space; and
(c) (ii) determining which of the second plurality of remaining possible data symbols corresponds to the input sample based on the placement of the input sample relative to the plurality of planes in the multi-dimensional space.

17. The signal space detector of claim 16 wherein the eliminating step (b)(i) comprises the steps of:

(b) (i) (1) determining placement of the second input sample relative to at least one additional plane in the multi-dimensional space; and
(b) (i) (2) eliminating the one of the first plurality of possible data symbols based on the placement of the second input sample relative to the at least one additional plane in the multi-dimensional space.

18. The signal space detector of claim 17 wherein the determining step (c) comprises:
- (c) (iii) determining placement of the second input sample relative to the first plurality of planes in the multi-dimensional space wherein the first plurality of planes divides the second plurality of remaining possible data symbols in the multi-dimensional space; and
- (c) (iv) determining which of the second plurality of remaining possible data symbols corresponds to the second input sample based on the placement of the second input sample relative to the plurality of planes in the multi-dimensional space.

19. A detector for detecting data read from a disc in a disc drive and provided as a sampled read signal including data samples in a plurality of time intervals, comprising:
- a receiver configured to receive the data samples; and
- means, coupled to the receiver, for detecting the data encoded according to a code having a time varying maximum transition run.

* * * * *

UNITED STATES PATENT AND TRADEMARK OFFICE
CERTIFICATE OF CORRECTION

PATENT NO. : 5,936,558
DATED : August 10, 1999
INVENTOR(S) : Hamid R. Shafiee et al.

It is certified that error appears in the above-identified patent and that said Letters Patent is hereby corrected as shown below:

Equations:

Column 6, Table 1, delete $[(a_{k-2}, a_{k-2}, a_k)]$
insert $--(a_{k-2}, a_{k-1}, a_k)--$ Column 8, Equation 9, delete $[(y''_{k-2} + f_1 y^1_{k-1} - f_1)]$ insert $-- y''_{k-2} + f_1 y^1_{k-1} + f_1 --$

UNITED STATES PATENT AND TRADEMARK OFFICE
CERTIFICATE OF CORRECTION

PATENT NO. : 5,936,558
DATED : August 10, 1999
INVENTOR(S) : Hamid R. Shafiee et al.

It is certified that error appears in the above-identified patent and that said Letters Patent is hereby corrected as shown below:

Column 8, Equation 12, delete $[(y''_{k-2} - (f_1 - f_2)y_k + )(f_1 + f_2)\hat{a}_{k-3}]$ insert -- $(y''_{k-2} - (f_1 - f_2)y_k + )(f_1 - f_2)\hat{a}_{k-3}$ --

In the Claims:

Column 9, line 35  delete [there]  insert --three--

Column 16, line 8  delete [(ii)  insert --(iv)--

Signed and Sealed this

Twenty-seventh Day of February, 2001

Attest:

NICHOLAS P. GODICI

Attesting Officer    Acting Director of the United States Patent and Trademark Office